United States Patent
Goto

(10) Patent No.: US 8,748,782 B2
(45) Date of Patent: Jun. 10, 2014

(54) CERAMIC HEATER

(75) Inventor: Yoshinobu Goto, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 491 days.

(21) Appl. No.: 13/190,796

(22) Filed: Jul. 26, 2011

(65) Prior Publication Data

US 2012/0018416 A1    Jan. 26, 2012

Related U.S. Application Data

(60) Provisional application No. 61/367,493, filed on Jul. 26, 2010.

(51) Int. Cl.
    *B23K 10/00*      (2006.01)

(52) U.S. Cl.
    USPC ..... 219/481; 219/412; 219/446.1; 219/468.1; 219/448.14; 118/725

(58) Field of Classification Search
    CPC ........................................................ H05B 3/74
    USPC ......... 219/121.43, 481, 494, 412–414, 446.1, 219/448.11, 448, 14, 468.1; 118/725
    See application file for complete search history.

(56) References Cited

U.S. PATENT DOCUMENTS

| | | | | |
|---|---|---|---|---|
| 6,914,222 | B2 * | 7/2005 | Nakamura | 219/444.1 |
| 7,417,206 | B2 * | 8/2008 | Nakamura | 219/444.1 |
| 7,751,657 | B2 * | 7/2010 | Lee | 385/12 |
| 7,887,670 | B2 * | 2/2011 | Koizumi et al. | 156/345.34 |
| 8,065,789 | B2 * | 11/2011 | Guenther et al. | 29/611 |

FOREIGN PATENT DOCUMENTS

JP     2005-166386     6/2005

* cited by examiner

*Primary Examiner* — Mark Paschall
(74) *Attorney, Agent, or Firm* — Burr & Brown, PLLC

(57) ABSTRACT

The ceramic heater 20 includes the ceramic substrate 22 and a hollow shaft 40. The ceramic substrate 22 is disk-shaped, and a resistance heating element 24 is embedded in the ceramic substrate 22. The hollow shaft 40 is attached to the center of a lower surface of the ceramic substrate 22. The ceramic substrate 22 has a rail groove 26 to which a slide lid 28 is attached and a guide groove 30 that serves as a thermocouple conduit. Moreover, a tube 32 is disposed outside the shaft 40. The tube 32 extends in the up-down direction and is connected to the guide groove 30.

12 Claims, 12 Drawing Sheets

(a)

(b)

(c)

(d)

(e)

CERAMIC HEATER

The present application claims priority from U.S. provisional application No. 61/367,493 filed on Jul. 26, 2010, the entire contents of which are incorporated in the present specification by reference.

BACKGROUND OF THE INVENTION

1. Field of the Invention

This invention relates to a ceramic heater.

2. Description of the Related Art

To date, ceramic heaters have been known. For example, a ceramic heater disclosed in Patent Document 1 includes a disk-shaped ceramic substrate and a hollow shaft. A resistance heating element is embedded in the ceramic substrate, and the hollow shaft is attached to the center of a lower surface of the ceramic substrate. An electricity feeding member that supplies electric power to the resistance heating element and a thermocouple that is capable of detecting the temperature in a vicinity of the center of the ceramic substrate are disposed in the shaft.

RELATED ART DOCUMENTS

Patent Document

Japanese Unexamined Patent Application Publication No. 2005-166386

SUMMARY OF THE INVENTION

In order to detect the temperature in a vicinity of an outer periphery of the ceramic substrate of an existing ceramic heater, it is necessary, for example, to drill a tunnel-like hole from the center of the ceramic substrate toward the outer periphery of the ceramic substrate. However, it is difficult to drill such a hole in the ceramic substrate. Apart from the thermocouple, it is also difficult to drill a gas channel from the center of the ceramic substrate toward the outer periphery of the ceramic substrate.

The main object of the present invention, which has been achieved to solve such a problem, is to provide a ceramic heater that has a conduit extending from the center of a ceramic substrate toward an outer periphery of the ceramic substrate and that can be obtained with a simple process.

The ceramic heater according to the present invention has the following structure to achieve the main object described above.

A ceramic heater in which a resistance heating element is embedded in a disk-shaped ceramic substrate, the ceramic heater includes:

a rail groove that is formed in a lower surface of the ceramic substrate so as to extend linearly from a side surface of the ceramic substrate toward a center of the ceramic substrate;

a ceramic slide lid that is slidable along the rail groove, the slide lid being engaged with a side wall of the rail groove so that the slide lid does not drop off from the rail groove; and a guide groove that is formed in an upper surface of the rail groove so as to extend in a longitudinal direction of the rail groove, the guide groove becoming an open space exposed to the outside when the slide lid is open and becoming a closed space shielded from the outside when the slide lid is closed.

With the ceramic heater according to the present invention, the guide groove can be exposed to the outside or shielded from the outside by sliding the slide lid along the rail groove. Because the guide groove can be formed by cutting the ceramic substrate, the process is simpler and less expensive than forming a tunnel in the ceramic substrate. Moreover, because the slide lid engages with the side wall of the rail groove, the slide lid does not drop off. In the present invention and the present specification, the terms "up" and "down" merely represent a relative positional relationship, and for example, a case where "up" is "down" and "down" is "up" and a case where "up" is "left" and "down" is "right" are also included in the meanings of these terms.

In the ceramic heater according to the present invention, a shape of a cross section of the slide lid taken along a plane perpendicular to the longitudinal direction may be a quadrangle whose upper side is longer than a lower side. In this case, the slide lid can be manufactured easily because the slide lid has a simple shape. Moreover, because the contact area between the slide lid and the rail groove is relatively small, ceramic particles are not easily generated even if the slide lid and the rail groove are rubbed against each other when the slide lid is slid.

In the ceramic heater according to the present invention, the guide groove may be a thermocouple conduit through which a thermocouple for measuring a temperature in a vicinity of an outer periphery of the ceramic substrate is passed, an electric wire conduit through which an electric wire for supplying electric power to the resistance heating element is passed, or a gas channel through which a predetermined gas passes. If the guide groove is a thermocouple conduit, it is preferable that an end portion of the thermocouple contained in the guide groove be pressed against the ceramic substrate by an elastic force. In this case, because a state in which the end portion of the thermocouple is in contact with the ceramic substrate can be maintained for a long time, the temperature can be accurately measured for a long time. To be specific, the thermocouple may be contained in the guide groove in a state in which the thermocouple is bent and is pressed by the slide lid, and the elastic force may be a restoring force of the thermocouple that tends to return to an original state from the state in which the thermocouple is pressed by the slide lid. Alternatively, the elastic force may be applied by an urging member that urges the end portion of the thermocouple toward the ceramic substrate.

The ceramic heater according to the present invention may further include a hollow shaft that is attached to a center of the lower surface of the ceramic substrate, and a tube that is formed outside the shaft so as to extend in an up-down direction and so as to be connected to the guide groove. For example, when the guide groove is used as a thermocouple conduit or an electric wire conduit, the influence of the external atmosphere is reduced because the thermocouple or the electric wire is covered and protected by the slide lid and the tube.

In the case where the ceramic heater according to the present invention includes the shaft and the tube, the tube may include a plurality of short pipes that are connected to one another, at least some of the pipes each having a recess and a protrusion, and the protrusion of one of two adjacent pipes may be inserted into the recess of the other of the two adjacent pipes. In this case, the tube can be easily attached and removed. The tube may have a fitting groove in an uppermost portion thereof, and a terminal end portion of the slide lid may be fitted into the fitting groove when the slide lid is closed. In this case, the position of a pipe that is in the uppermost position of the tube in the up-down direction is fixed by the slide lid.

DETAILED DESCRIPTION OF THE INVENTION

Figure 1:
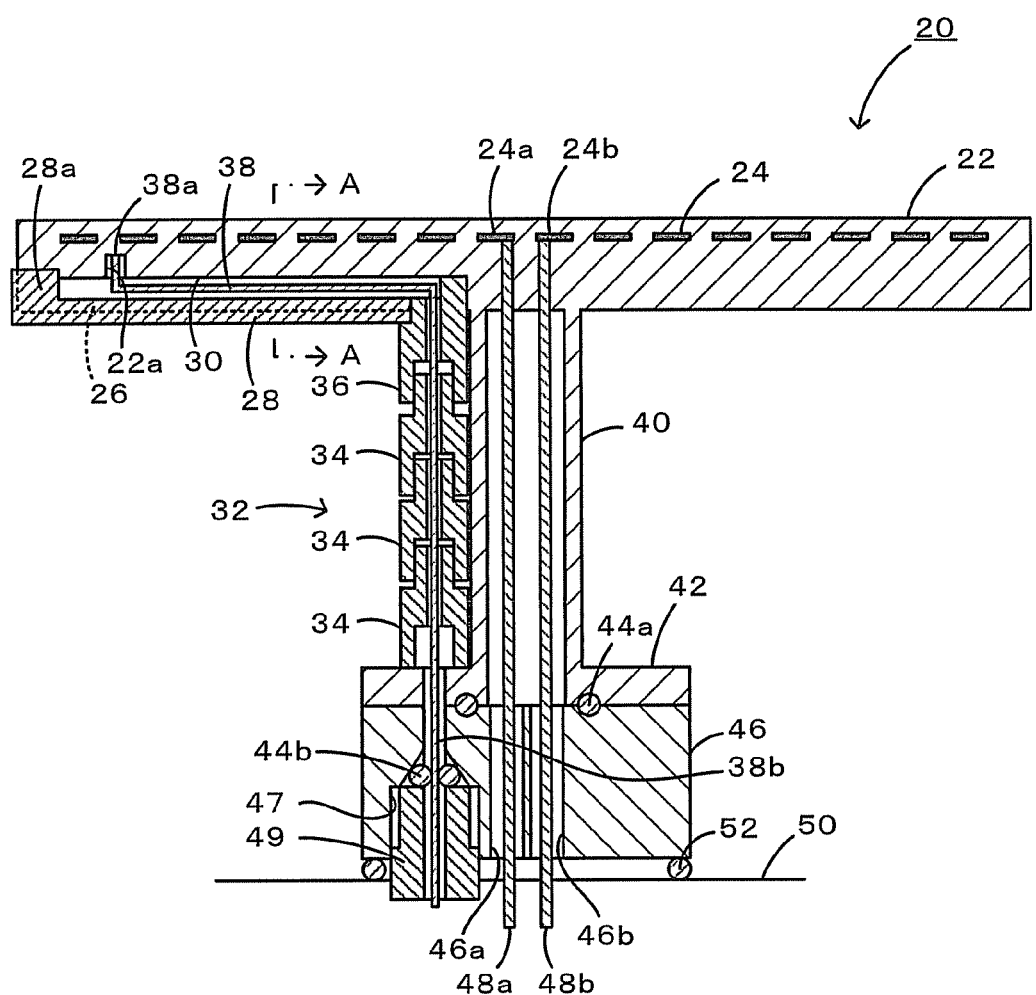
FIG. 1 is a schematic sectional view of a ceramic heater 20.
Figure 2:
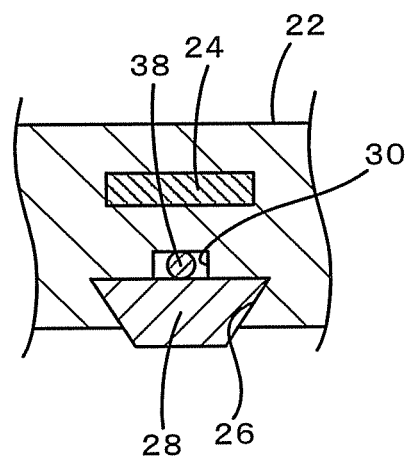
FIG. 2 is a (partial) sectional view of FIG. 1 taken along line A-A.
Figure 3:
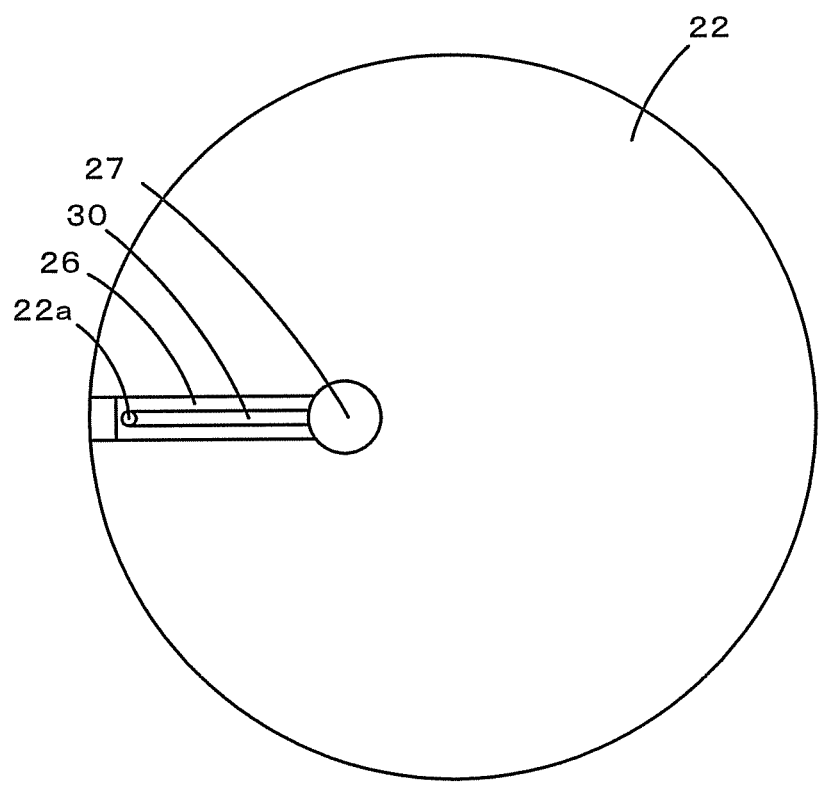
FIG. 3 is a bottom view of a ceramic substrate 22.
Figure 4:
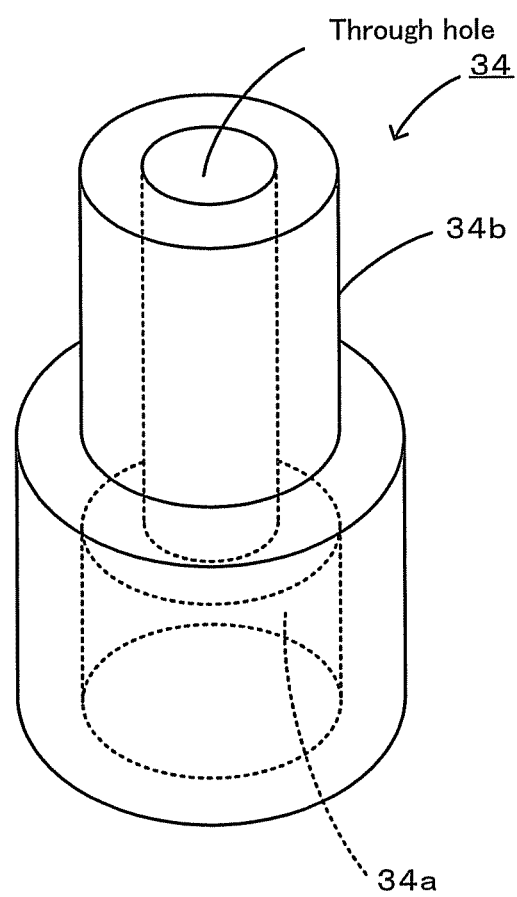
FIG. 4 is a perspective view of a first pipe 34.
Figure 5:
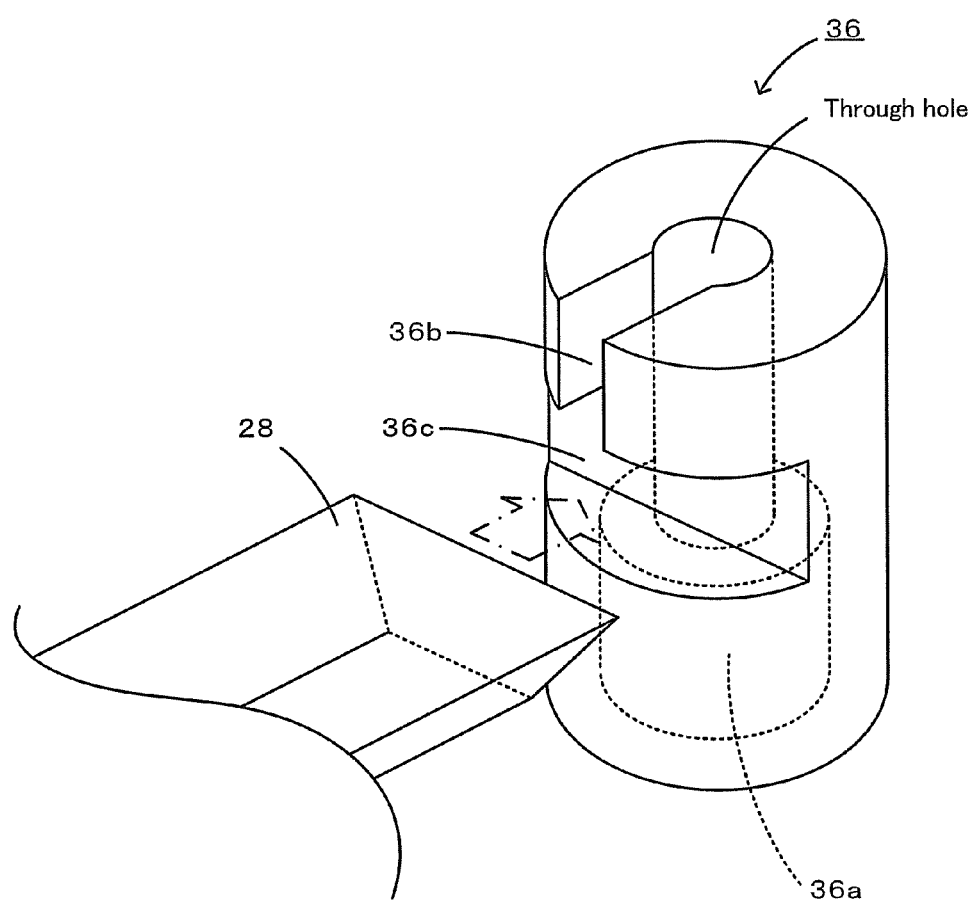
FIG. 5 is a perspective view of a second pipe 36.
Figure 6:
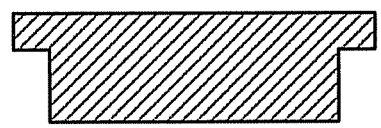
FIGS. 6(a) to 6(e) are sectional views of various slide lids.
Figure 6:
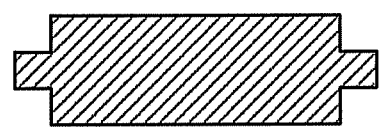
Figure 6:
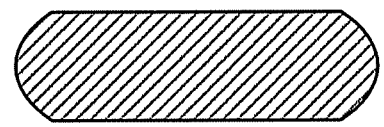
Figure 6:
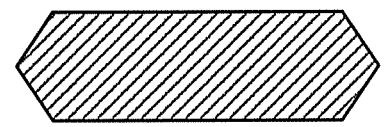
Figure 6:
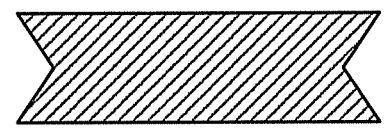

Next, an embodiment of the present invention will be described with reference to the drawings. FIG. 1 is a schematic sectional view of a ceramic heater 20, FIG. 2 is a (partial) sectional view of FIG. 1 taken along line A-A, FIG. 3 is a bottom view of a ceramic substrate 22, FIG. 4 is a perspective view of a first pipe 34, and FIG. 5 is a perspective view of a second pipe 36.

The ceramic heater 20 includes the ceramic substrate 22 and a hollow shaft 40. The ceramic substrate 22 is disk-shaped, and a resistance heating element 24 is embedded in the ceramic substrate 22. The hollow shaft 40 is attached to the center of a lower surface of the ceramic substrate 22. The ceramic substrate 22 has a rail groove 26 to which a slide lid 28 is attached and a guide groove 30 that serves as a thermocouple conduit. Moreover, a tube 32 is disposed outside the shaft 40. The tube 32 extends in the up-down direction and is connected to the guide groove 30.

The ceramic substrate 22 is made of, for example, an aluminum nitride (AlN) ceramic. The resistance heating element 24 is made of, for example, tungsten (W) or molybdenum (Mo). The resistance heating element 24 is formed along a unicursal curve that extends from a terminal 24a disposed in a vicinity of the center of the ceramic substrate 22, over the entire area of the ceramic substrate 22, and to another terminal 24b disposed in a vicinity of the center.

The shaft 40 is made of a material the same as that of the ceramic substrate 22. The shaft 40 has a flange 42 at a lower end thereof. The flange 42 is fixed to a support member 46 with an O-ring 44a therebetween. The support member 46 is fixed to a base 50 with an O-ring 52 therebetween. An inner space of the shaft 40 is connected to two center holes 46a and 46b in the support member 46. An electricity feeding member 48a is inserted into the center hole 46a in the support member 46. The electricity feeding member 48a extends through the inner space of the shaft 40, and an end thereof is connected to the terminal 24a of the resistance heating element 24. An electricity feeding member 48b is inserted into the center hole 46b in the support member 46. The electricity feeding member 48b extends through the inner space of the shaft 40, and an end thereof is connected to the terminal 24b of the resistance heating element 24. The resistance heating element 24 is supplied with an electrode from the outside through the electricity feeding members 48a and 48b, and generates heat. It is necessary to maintain hermeticity of a thermocouple 38 to prevent a chamber gas from leaking to the outside of the chamber by using an O-ring or the like. To be specific, hermeticity is maintained by setting an O-ring 44b on an outer surface of a sheath 38b of the thermocouple 38 located in the support member 46 and by screwing a hollow fixing bolt 49 into a screw hole 47 so as to press the O-ring 44b against a tapering portion of the screw hole 47. It is preferable that the sheath 38b have a surface roughness Ra≤0.6 μm.

The rail groove 26 is formed in the lower surface of the ceramic substrate 22 so as to extend linearly from a side surface of the ceramic substrate 22 toward the center of the ceramic substrate 22. The slide lid 28 is slidably attached to the rail groove 26. The slide lid 28 engages with a side wall of the rail groove 26 so that the slide lid 28 does not drop off from the rail groove 26. To be specific, as illustrated in FIG. 2, the shape of a cross section of the slide lid 28 taken along a plane perpendicular to the longitudinal direction is a quadrangle (here, a trapezoid) whose upper side is longer than a lower side. The side wall of the rail groove 26 has a tapering surface corresponding to the side surface of the slide lid 28. As a result, the side surface of the slide lid 28 engages with the side wall of the rail groove 26, and thereby the slide lid 28 does not drop off. An end portion of the rail groove 26 (an end portion near the side surface) has a larger depth. This is because an end portion 28a of the slide lid 28 (an end portion near the side surface) has a larger thickness, and the end portion of the rail groove 26 need to contain the thick portion of the slide lid 28.

The guide groove 30 is formed in an upper surface of the rail groove 26 so as to extend in the longitudinal direction of the rail groove 26. The guide groove 30 becomes an open space exposed to the outside when the slide lid 28 is open and becomes a closed space shielded from the outside when the slide lid 28 is closed. The guide groove 30 serves as a thermocouple conduit through which the thermocouple 38 for measuring the temperature in a vicinity of an outer periphery of the ceramic substrate 22 is passed.

The tube 32 includes a plurality of first pipes 34 that are connected to one another in the up-down direction and the second pipe 36 that is disposed in an uppermost portion thereof. Each of the first pipes 34 is short and has a recess 34a and a protrusion 34b. The second pipe 36 has a recess 36a. The first pipe 34 is a stepped cylindrical body made of a ceramic (for example, an alumina ceramic) (see FIG. 4). The recess 34a extends upward from a lower surface of a larger-diameter cylinder portion and the protrusion 34b is a smaller-diameter cylinder in which a through hole is formed in the up-down direction. The diameter of the recess 34a substantially corresponds to the outside diameter of the protrusion 34b. The protrusion 34b of one of two adjacent first pipes 34 is inserted into the recess 34a of the other of the two adjacent first pipes 34. The second pipe 36 is an unstepped cylindrical body made of a ceramic (for example, an alumina ceramic) (see FIG. 5), and the recess 36a extends upward from a lower surface thereof. The recess 36a also substantially corresponds to the outside diameter of the protrusion 34b. The protrusion 34b of one of the first pipes 34 is inserted into the recess 36a. The second pipe 36 has a through hole extending in the up-down direction. A cutout 36b that connects the through hole to the guide groove 30 is disposed above the second pipe 36. Moreover, the second pipe 36 has a fitting groove 36c into which a terminal end portion of the slide lid 28 is fitted when the slide lid 28 is closed. A circular groove 27 into which the second pipe 36 is fitted is formed in the ceramic substrate 22 at a terminal end of the rail groove 26 (an end near the center). Therefore, the position of the second pipe 36 in a horizontal direction is fixed by the circular groove 27, and the position of the second pipe 36 in the up-down direction is fixed by the slide lid 28.

The thermocouple 38 extends from below the base 50, via through holes formed in the support member 46 and the flange 42, upward in the inner space in the tube 32, through the guide groove 30, and to a vicinity of an outer periphery of the ceramic substrate 22. The thermocouple 38 is capable of detecting the temperature in the vicinity of the outer periphery of the ceramic substrate 22. To be specific, an end portion 38a of the thermocouple 38 is inserted into a hole 22a formed in the lower surface of the ceramic substrate 22 in the vicinity of the outer periphery, and the end portion 38a is in contact with a bottom surface (in FIG. 1, an upper surface) of the hole 22a.

In the ceramic heater 20 of the present embodiment, the thermocouple 38, which is capable of detecting the temperature in a vicinity of an outer periphery of the ceramic substrate 22, is not passed through a tunnel drilled in the ceramic substrate 22 but is passed through the guide groove 30 covered by the slide lid 28. Because the guide groove 30 can be formed by a process of cutting a back surface of the ceramic substrate 22, the process is simpler and less expensive than forming a tunnel in the ceramic substrate 22. Because the slide lid 28 engages with the side wall of the rail groove 26, the slide lid 28 does not drop off. Moreover, because the thermocouple 38 is covered and protected by the slide lid 28 made of a ceramic and the tube 32 made of a ceramic, corrosion due to a plasma gas is suppressed. Furthermore, the tube 32 can be readily removed, because the tube 32 is formed by connecting the short pipes 34 and 36 to one another by simply fitting the protrusions into the recesses. The slide lid 28 can also be readily removed from the rail groove 26 by sliding the slide lid 28. Therefore, when it is necessary to replace the thermocouple 38, the slide lid 28 may be first drawn out from the rail groove 26, and then the tube 32 and the thermocouple 38 may be simultaneously removed while compressing the tube 32 so that gaps between the pipes 34 and 36 are eliminated. After the thermocouple 38 has been removed, a new thermocouple may be attached by performing the above-described steps in the reverse order.

It is to be understood that the present invention is not limited to the embodiments described above, and can be realized in various forms within the technical scope of the present invention.

For example, in the embodiment described above, the pipes 34 and 36 made of a ceramic are connected to one another and used as the tube 32, because it is assumed that the operating temperature of the ceramic heater 20 is high. If the operating temperature is low, a tube made of a fluorocarbon polymer (for example, a tube made of PTFE) may be used as the tube 32.

In the embodiment described above, the shape of a cross section of the slide lid 28 taken along a plane perpendicular to the longitudinal direction is a quadrangle illustrated in FIG. 2. Instead, any of the shapes illustrated in FIGS. 6(a) to 6(f) may be used. In this case, the side surface of the rail groove 26 is changed so as to match the shape that is used.

Figure 7:
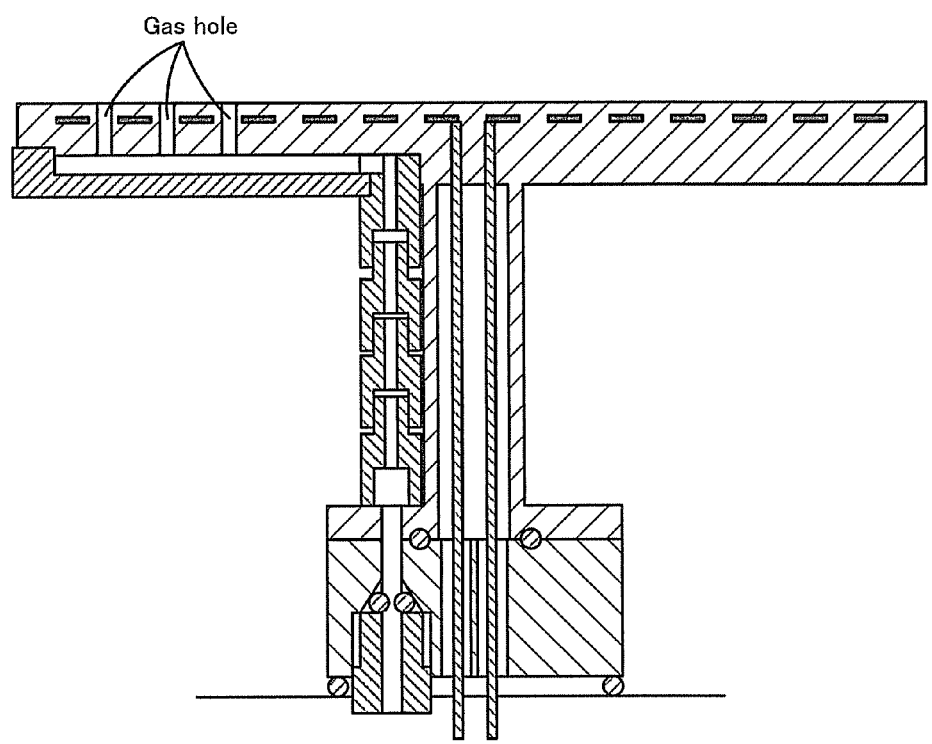
FIG. 7 is a schematic sectional view of another ceramic heater.
Figure 8:
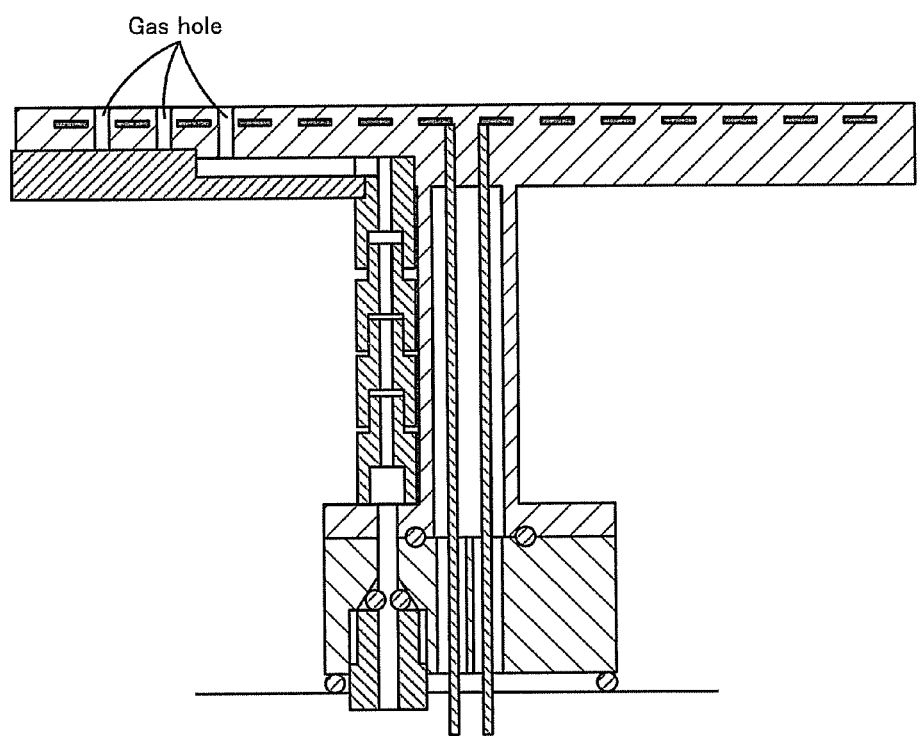
FIG. 8 is a schematic sectional view of another ceramic heater.

In the embodiment described above, the guide groove 30 is used as a thermocouple conduit. Alternatively, the guide groove 30 may be used as a conduit for an electric wire for supplying electric power to the resistance heating element 24. Further alternatively, as illustrated in FIG. 7, the inner spaces of the guide groove 30 and the tube 32 may be used as a gas channel. In this case, as illustrated in FIG. 8, holes that are used for passing gas and holes that are not used for passing gas can be selectively provided by adjusting the length of the thick portion at an end of the slide lid 28 (an end near a side surface of the ceramic substrate 22).

Figure 9:
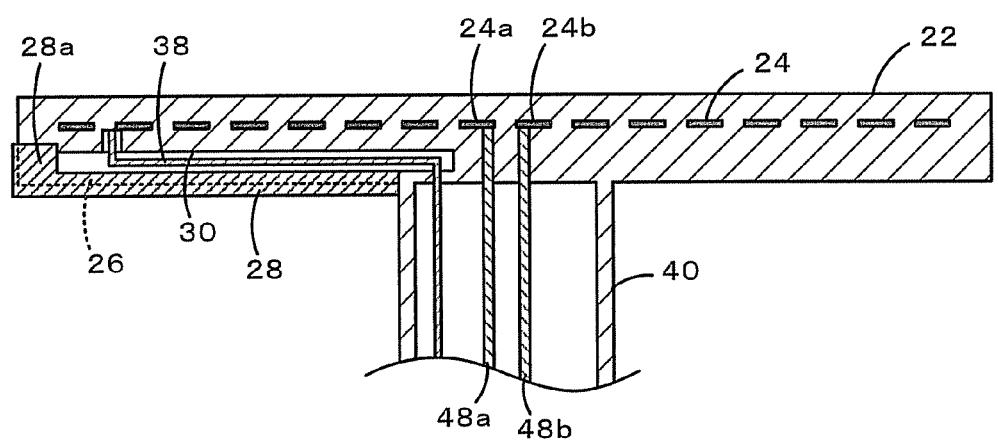
FIG. 9 is a schematic sectional view of another ceramic heater.

In the embodiment described above, a portion of the thermocouple 38 extending in the up-down direction is passed through the tube 32, which is disposed outside the shaft 40. As illustrated in FIG. 9, the portion may be passed through the inside of the shaft 40. In this case, a proximal end of the guide groove 30 (an end near the center of the ceramic substrate 22) is connected to the inside of the shaft 40. In this case, the tube 32 is not necessary.

EXAMPLES

Samples 1 to 15

Figure 10:
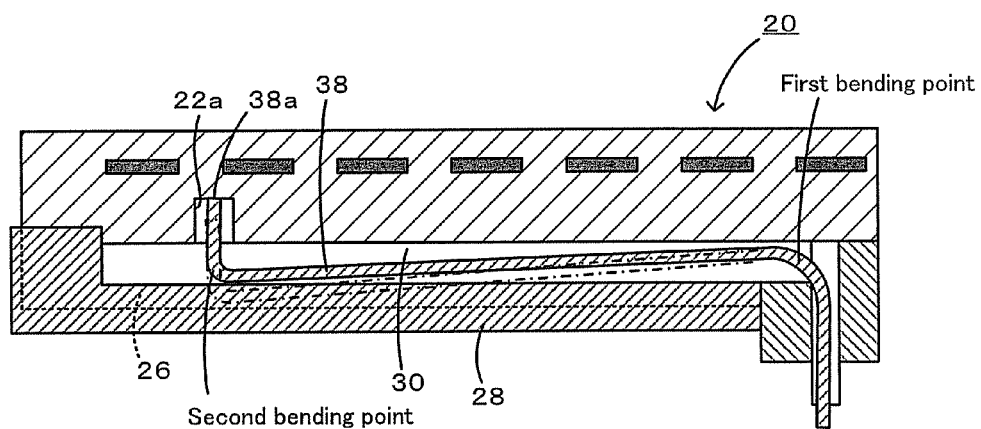
FIG. 10 is a sectional view illustrating an example in which an end portion 38a is pressed against a bottom surface of a hole 22a by an elastic force.
Figure 11:
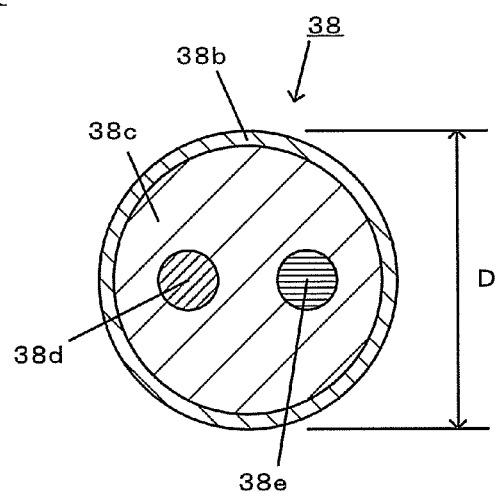
FIG. 11 is a sectional view of a thermocouple 38.

With the ceramic heater 20 illustrated in FIG. 1, it is necessary that the end portion 38a of the thermocouple 38 be closely and stably in contact with the hole 22a formed in the lower surface of an outer periphery of the ceramic substrate 22 so that the thermocouple 38 can accurately measure the temperature in a vicinity of the outer periphery of the ceramic substrate 22. For this reason, it is preferable that the end portion 38a be pressed against the bottom surface of the hole 22a by an elastic force. FIG. 10 illustrates an example of such a structure. In FIG. 10, a sheath thermocouple is used as the thermocouple 38. The thermocouple 38 is bent at a first bending point and at a second bending point to form a Z-shape (see alternate long and short dashed line). When the thermocouple 38 is contained in the guide groove 30 in this state and the slide lid 28 is closed, the end portion 38a of the Z-shaped thermocouple 38 is pressed upward by the slide lid 28 (see solid line). Then, a restoring force that is generated by the thermocouple 38 so as to restore the original state from the pressed state is used as the elastic force, and the end portion 38a is pressed against the bottom surface of the hole 22a by the elastic force. FIG. 11 is a sectional view of the thermocouple 38. As illustrated in FIG. 11, the thermocouple 38 includes the sheath 38b that is made of a stainless steel, an electrically insulating filler 38c with which the inside of the sheath 38b is filled, and a pair of type-K thermocouple element wires 38d and 38e that are inserted into the electrically insulating filler 38c.

In practice, to realize the structure illustrated in FIG. 10, a plurality of the thermocouples 38 having different sheath diameters and different lengths were prepared. Each of the thermocouples 38 was bent at two positions to form a Z-shape and was contained in the guide groove 30, and the slide lid 28 was closed in this state, so that the end portion 38a of the Z-shaped thermocouple 38 was pressed upward by the slide lid 28. Then, the temperature of the ceramic heater 20 was increased to 500° C., and thereafter the temperature was maintained at 500° C. Temperature readings of the thermocouple 38 one day, three weeks, and six months after the thermocouple 38 had been set were obtained. If the temperature reading was 500±2° C., it was evaluated that the temperature measurement was accurate, and otherwise it was evaluated that the temperature measurement was inaccurate.

Figure 12:
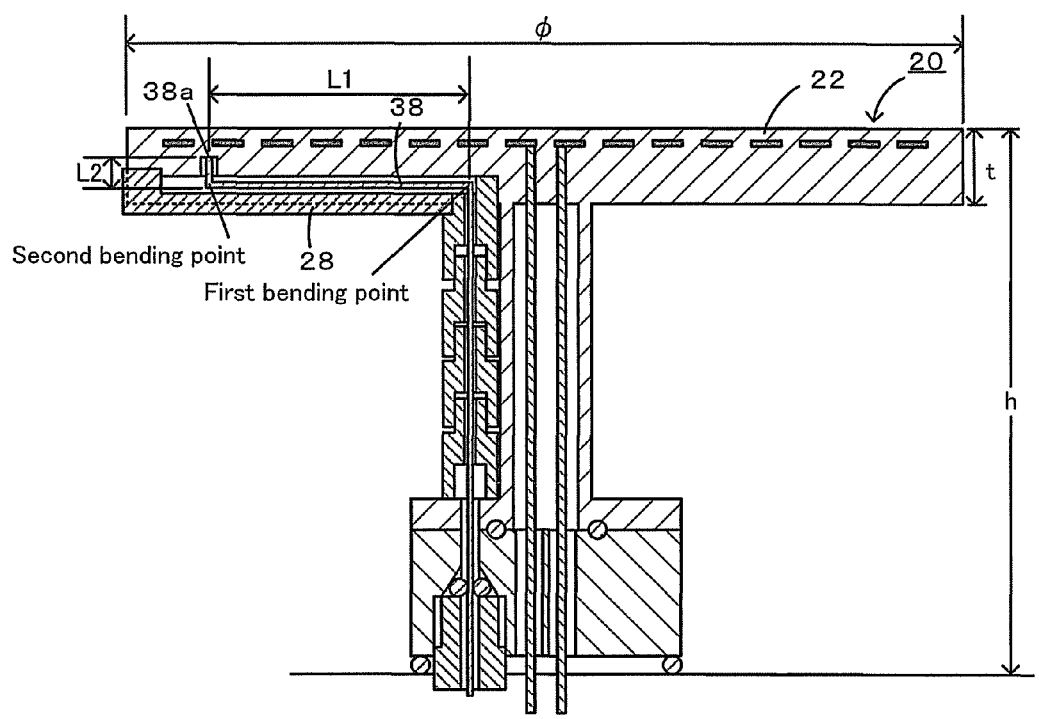
FIG. 12 illustrates symbols for representing the dimensions of the ceramic heater 20.

The ceramic heater 20 used was as follows: aluminum nitride (AlN) is used as the ceramic material; the outside diameter $\phi$ of the ceramic substrate 22 was 350 mm, the thickness t of the ceramic substrate 22 was 20 mm, and the height h of the ceramic substrate 22 was 250 mm; the length L1 from the first bending point to the second bending point of the thermocouple 38 was 65 mm, 115 mm, or 165 mmm; and the length L2 from the second bending point to the end portion 38a of the thermocouple 38 was 12 mm (see FIG. 12 for $\phi$, t, etc.). The thermocouple 38 was bent at the bending points so as to form rounded bent portions rather than angular bent portions. Although the thermocouple 38 cannot be set unless the radii of curvature of the rounded bent portions are sufficiently small, the sheath may be broken if the radii of curvature are too small. This time, the radii of curvature of the rounded bent portions were equal to the sheath outside diameter D. The thermocouple 38 used was as follows: the sheath 38b was made of a stainless steel (SUS316); the electrically insulating filler 38c was made of magnesium oxide (MgO); and the sheath outside diameter D was 0.5 mm, 1 mm, 1.6 mm, 2.3 mm, or 3.2 mm. The atmosphere in the chamber (surrounding the thermocouple 38) was $N_2$ atmosphere having a pressure of 0.1 Torr.

Table 1 illustrates the sheath outside diameter D, the length L1, and the bending result of the sheath thermocouple used. Table 1 also illustrates temperature readings in the initial state, after one day, after three weeks, and after six months. The overall rating is also shown. The overall rating was "O" if bending was successfully performed and the temperature measurement was accurate until after six months, and the overall rating was otherwise "x". The samples 1 to 15 illustrated in Table 1 each correspond to an example of the present invention.

elastic force was not sufficiently generated, and the temperature measurement was inaccurate (samples 5 and 6).

When the sheath outside diameter D was 1.6 mm, bending was successfully performed irrespective of the length L1, the rigidity was appropriate, an elastic force for pressing the end portion 38a of the thermocouple 38 against the bottom surface of the hole 22a was sufficiently generated, and the temperature reading was accurate after six months (samples 7 to 9).

When the sheath outside diameter D was 2.3 mm and the length L1 was small or intermediate, the rigidity was too high and bending could not be performed (samples 10 and 11). On the other hand, when the length L1 was large, bending was successfully performed, the rigidity was appropriate, an elastic force for pressing the end portion 38a of the thermocouple 38 against the bottom surface of the hole 22a was sufficiently generated, and the temperature reading was accurate after six months (sample 12).

When the sheath outside diameter D was 3.2 mm, irrespective of the length L1, the rigidity was too high and bending could not be performed (samples 13 to 15).

TABLE 1

| | Sheath Thermocouple | | | TC Temperature Reading (° C.) | | | | | |
|---|---|---|---|---|---|---|---|---|---|
| Sample | Sheath Outside Diameter D (mm) | Length L1 (mm) | Bending | Initial State | After One Day | After Three Weeks | After Six Months | Overall Rating | Note |
| 1 | 0.5 | 65 | O | 501 | 477 | — | — | X | Poor Contact after 500° C. × One Day due to Low Rigidity |
| 2 | 0.5 | 115 | O | 493 | 478 | — | — | X | Poor Contact after 500° C. × One Day due to Low Rigidity |
| 3 | 0.5 | 165 | O | 479 | — | — | — | X | Elastic Force insufficient to cause Contact with Bottom of Hole due to Low Rigidity |
| 4 | 1 | 65 | O | 502 | 501 | 500 | 501 | O | Stable Temperature Measurement possible after 500° C. × Six Months |
| 5 | 1 | 115 | O | 501 | 500 | 478 | — | X | Poor Contact after 500° C. × Three Weeks due to Low Rigidity |
| 6 | 1 | 165 | O | 501 | 476 | — | — | X | Poor Contact after 500° C. × One Day due to Low Rigidity |
| 7 | 1.6 | 65 | O | 502 | 500 | 501 | 502 | O | Stable Temperature Measurement possible after 500° C. × Six Months |
| 8 | 1.6 | 115 | O | 501 | 502 | 502 | 500 | O | Stable Temperature Measurement possible after 500° C. × Six Months |
| 9 | 1.6 | 165 | O | 502 | 501 | 501 | 502 | O | Stable Temperature Measurement possible after 500° C. × Six Months |
| 10 | 2.3 | 65 | X | — | — | — | — | X | Unable to Bend TC at 90° |
| 11 | 2.3 | 115 | X | — | — | — | — | X | Unable to Bend TC at 90° |
| 12 | 2.3 | 165 | O | 501 | 500 | 501 | 500 | O | Stable Temperature Measurement possible after 500° C. × Six Months |
| 13 | 3.2 | 65 | X | — | — | — | — | X | Unable to Bend TC at 90° |
| 14 | 3.2 | 115 | X | — | — | — | — | X | Unable to Bend TC at 90° |
| 15 | 3.2 | 165 | X | — | — | — | — | X | Unable to Bend TC at 90° |

When the sheath outside diameter D was 0.5 mm, bending was successfully performed irrespective of the length L1. However, because the rigidity was too low, an elastic force for pressing the end portion 38a of the thermocouple 38 against the bottom surface of the hole 22a was not sufficiently generated, and the temperature measurement was inaccurate (samples 1 to 3).

When the sheath outside diameter D was 1 mm, bending was successfully performed irrespective of the length L1. When the length L1 was small, the rigidity was appropriate, an elastic force for pressing the end portion 38a of the thermocouple 38 against the bottom surface of the hole 22a was sufficiently generated, and the temperature reading was accurate after six months (sample 4). However, when the length L1 was large or intermediate, the rigidity was too low and the Samples 16 to 21

Figure 13:
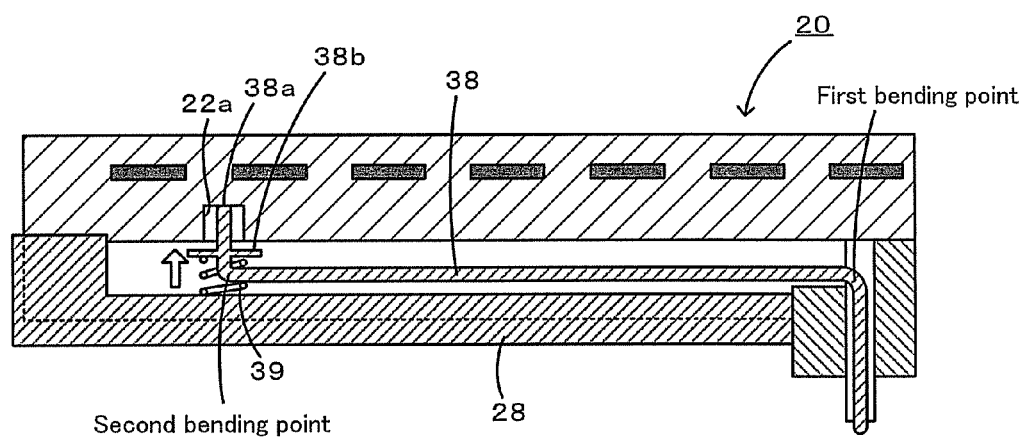
FIG. 13 is a sectional view illustrating another example in which the end portion 38a is pressed against the bottom surface of the hole 22a by an elastic force.

FIG. 13 is a sectional view illustrating another example, which is different from that of FIG. 10, for pressing the end portion 38a of the thermocouple 38 against the bottom surface of the hole 22a by an elastic force. In FIG. 13, a collar 38b is disposed between the end portion 38a of the thermocouple 38 and the second bending point, a compression spring 39 (urging member) is disposed between the collar 38b and the slide lid 28, and the end portion 38a of the thermocouple 38 is pressed against the bottom surface of the hole 22a by using the compression spring 39. A counterbore (not shown) for receiving the compression spring 39 is formed in the slide lid 28. The pitch of the compression spring 38 is set such that the compression spring 38 does not interfere with a substantially horizontal portion of the thermocouple 38.

In practice, the compression spring 39 and a plurality of thermocouples 38 having the collars 38b and having different sheath diameters and different lengths were prepared and assembled to form the structure illustrated in FIG. 13. Then, the temperature of the ceramic heater was increased to 500° C., and thereafter the temperature was maintained at 500° C. Temperature readings of the thermocouple 38 one day, three weeks, and six months after the thermocouple 38 had been set were obtained. If the temperature reading was 500±2° C., it was evaluated that the temperature measurement was accurate, and otherwise it was evaluated that the temperature measurement was inaccurate. Except that the thermocouple 38 had the collar 38b, the dimensions of the thermocouple 38 were the same as those of the samples 1 to 6 described above.

Table 2 illustrates the sheath outside diameter D, the length L1, and the bending result of the sheath thermocouple used; and temperature readings in the initial state, after one day, after three weeks, and after six months. The overall rating is also shown. The samples 16 to 21 illustrated in Table 2 each correspond to an example of the present invention.

As is clear from Table 2, in both cases where the sheath outside diameter D was 0.5 mm and 1.6 mm, bending was successfully performed irrespective of the length L1. Moreover, because the compression spring 39 was used, an elastic force for pressing the end portion 38a of the thermocouple 38 against the bottom surface of the hole 22a was sufficiently generated, and the temperature measurement was accurate until after six months (samples 16 to 21).

and SUS. It is supposed that AlN was generated when the slide lid 28 and the rail groove 26 were rubbed against each other due to thermal expansion. It is supposed that SUS, which was generated due to oxidization of the sheath of the thermocouple, was not scattered into the chamber in a large amount and did not easily become particles for the silicon wafer if the hermeticity between the slide lid 28 and the rail groove 26 was high. With consideration of use in semiconductor manufacturing equipment, it is preferable that the number of particles having a size larger than 0.1 μm be equal to or smaller than 1000. The atmosphere in the chamber (surrounding the thermocouple 38) was $N_2+O_2$ atmosphere, and the pressure of the atmosphere was 0.1 Torr. Table 3 illustrates the results. The samples 22 to 27 illustrated in Table 3 each correspond to an example of the present invention.

As is clear from Table 3, the number of particles, i.e., contamination was the minimum when the shape of the cross section of the slide lid 28 was a trapezoid (sectional shape f) having an upper side that is larger than a lower side (sample 27). It is supposed that SUS particles did not easily escape from the thermocouple 38 because the sectional shape f is simple and thereby gap between the slide lid 28 and the ceramic substrate 22 was small. It is supposed that, although AlN particles were generated when the slide lid 28 and the ceramic substrate 22 were rubbed against each other, the number of AlN particles generated was suppressed because the contact area between the slide lid 28 having the sectional shape f and the ceramic substrate 22 was small.

TABLE 2

| | Sheath Thermocouple | | | TC Temperature Reading (° C.) | | | | | |
|---|---|---|---|---|---|---|---|---|---|
| Sample | Sheath Outside Diameter D (mm) | Length L1 (mm) | Bending | Initial State | After One Day | After Three Weeks | After Six Months | Overall Rating | Note |
| 16 | 0.5 | 65 | ○ | 501 | 501 | 498 | 498 | ○ | Stable Temperature Measurement possible after 500° C. × Six Months |
| 17 | 0.5 | 115 | ○ | 502 | 500 | 500 | 499 | ○ | Stable Temperature Measurement possible after 500° C. × Six Months |
| 18 | 0.5 | 165 | ○ | 498 | 499 | 501 | 499 | ○ | Stable Temperature Measurement possible after 500° C. × Six Months |
| 19 | 1 | 65 | ○ | 502 | 501 | 500 | 499 | ○ | Stable Temperature Measurement possible after 500° C. × Six Months |
| 20 | 1 | 115 | ○ | 499 | 500 | 502 | 502 | ○ | Stable Temperature Measurement possible after 500° C. × Six Months |
| 21 | 1 | 165 | ○ | 501 | 498 | 499 | 500 | ○ | Stable Temperature Measurement possible after 500° C. × Six Months |

Samples 22 to 27

Regarding the ceramic heater 20 of FIG. 1, the relationship between the shape of a cross section of the slide lid 28 (taken along a plane perpendicular to the longitudinal direction) and the number of particles was examined. The ceramic heater 20 used was made of an AlN ceramic. The slide lid 28 had a maximum width of 8 mm and a thickness of 4 mm, and the slide lid 28 protruded from the lower surface of the ceramic substrate 22 by 1 mm. Then a silicon wafer was placed on the upper surface of the ceramic heater 20, and the number of particles on a surface of the silicon wafer after the temperature had been maintained at 500° C. for 24 hours was examined by using a wafer inspection apparatus (Surf scan SP2 manufactured by KLA-Tencor Co.). Moreover, the components of the particle were analyzed by using EPMA. As a result, it was determined that the particles derived from AlN

TABLE 3

| Sample | Shape of cross section of slide lid | Number of particles (Number) |
|---|---|---|
| 22 | a = 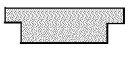 | 2700 |
| 23 | b = 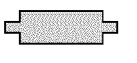 | 2250 |
| 24 | c = 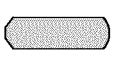 | 1350 |
| 25 | d =  | 1200 |
| 26 | e =  | 1500 |

TABLE 3-continued

| Sample | Shape of cross section of slide lid | Number of particles (Number) |
|---|---|---|
| 27 | f = 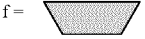 | 900 |

What is claimed is:

1. A ceramic heater in which a resistance heating element is embedded in a disk-shaped ceramic substrate, the ceramic heater comprising:
a rail groove that is formed in a lower surface of the ceramic substrate so as to extend linearly from a side surface of the ceramic substrate toward a center of the ceramic substrate;
a ceramic slide lid that is slidable along the rail groove, the slide lid being engaged with a side wall of the rail groove so that the slide lid does not drop off from the rail groove; and
a guide groove that is formed in an upper surface of the rail groove so as to extend in a longitudinal direction of the rail groove, the guide groove becoming an open space exposed to the outside when the slide lid is open and becoming a closed space shielded from the outside when the slide lid is closed.

2. The ceramic heater according to claim 1, wherein a shape of a cross section of the slide lid taken along a plane perpendicular to the longitudinal direction is a quadrangle whose upper side is longer than a lower side.

3. The ceramic heater according to claim 1, wherein the guide groove is a thermocouple conduit through which a thermocouple for measuring a temperature in a vicinity of an outer periphery of the ceramic substrate is passed.

4. The ceramic heater according to claim 3, wherein an end portion of the thermocouple is pressed against the ceramic substrate by an elastic force.

5. The ceramic heater according to claim 4, wherein the thermocouple is contained in the guide groove in a state in which the thermocouple is bent and is pressed by the slide lid, and
wherein the elastic force is a restoring force of the thermocouple that tends to return to an original state from the state in which the thermocouple is pressed by the slide lid.

6. The ceramic heater according to claim 4, wherein the elastic force is applied by an urging member that urges the end portion of the thermocouple toward the ceramic substrate.

7. The ceramic heater according to claim 1, wherein the guide groove is an electric wire conduit through which an electric wire for supplying electric power to the resistance heating element is passed.

8. The ceramic heater according to claim 1, wherein the guide groove is a gas channel through which a predetermined gas passes.

9. The ceramic heater according to claim 1, further comprising:
a hollow shaft that is attached to a center of the lower surface of the ceramic substrate; and
a tube that is formed outside the shaft so as to extend in an up-down direction and so as to be connected to the guide groove.

10. The ceramic heater according to claim 9, wherein the tube includes a plurality of short pipes that are connected to one another, at least some of the pipes each having a recess and a protrusion, and the protrusion of one of two adjacent pipes is inserted into the recess of the other of the two adjacent pipes.

11. The ceramic heater according to claim 9, wherein the tube has a fitting groove in an uppermost portion thereof, and a terminal end portion of the slide lid is fitted into the fitting groove when the slide lid is closed.

12. The ceramic heater according to claim 2, wherein the guide groove is a gas channel through which a predetermined gas passes.

* * * * *